(12) United States Patent
Ide et al.

(10) Patent No.: US 10,649,844 B2
(45) Date of Patent: May 12, 2020

(54) MEMORY SYSTEM

(71) Applicant: TOSHIBA MEMORY CORPORATION, Minato-ku, Tokyo (JP)

(72) Inventors: Takashi Ide, Kanagawa (JP); Yoshihisa Kojima, Kanagawa (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 105 days.

(21) Appl. No.: 15/921,566

(22) Filed: Mar. 14, 2018

(65) Prior Publication Data

US 2018/0276073 A1  Sep. 27, 2018

(30) Foreign Application Priority Data

Mar. 22, 2017  (JP) ................................ 2017-056573

(51) Int. Cl.

| G06F 11/10 | (2006.01) |
|---|---|
| G11C 29/52 | (2006.01) |
| G06F 3/06 | (2006.01) |
| G11C 29/04 | (2006.01) |

(52) U.S. Cl.
CPC .......... *G06F 11/1068* (2013.01); *G06F 3/064* (2013.01); *G06F 3/0619* (2013.01); *G06F 3/0679* (2013.01); *G11C 29/52* (2013.01); *G11C 2029/0409* (2013.01); *G11C 2029/0411* (2013.01)

(58) Field of Classification Search
CPC .... G11C 2029/0409; G11C 2029/0411; G11C 29/52; G06F 11/1068; G06F 3/0619; G06F 3/0679; G06F 3/064
See application file for complete search history.

(56) References Cited

U.S. PATENT DOCUMENTS

| 9,244,763 | B1 | 1/2016 | Kankani et al. | |
|---|---|---|---|---|
| 9,274,895 | B1 | 3/2016 | Wojahn | |
| 9,502,129 | B1 | 11/2016 | Suzuki et al. | |
| 2014/0351629 | A1* | 11/2014 | Ware ...................... | G11C 29/42 714/6.13 |
| 2015/0220394 | A1 | 8/2015 | Tanaka | |
| 2016/0041887 | A1* | 2/2016 | Davis .................. | G06F 11/1612 714/6.2 |

* cited by examiner

*Primary Examiner* — Guy J Lamarre
(74) *Attorney, Agent, or Firm* — Foley & Lardner LLP

(57) ABSTRACT

A memory system includes a nonvolatile memory, a memory controller included in a first package, and a memory interface circuit included in a second package that is different from the first package. The memory controller includes an encoder for performing encoding for error correction. The memory controller is configured to encode first data into second data using the encoder, and program the second data into a location in the nonvolatile memory. The memory interface circuit is interposed between the memory and the memory controller. The memory interface circuit includes a decoder for performing decoding for error correction. The memory interface circuit is configured to read third data from a first location in the nonvolatile memory, diagnose the third data by decoding the third data using the decoder, and convey a result of the diagnosis to the memory controller.

19 Claims, 10 Drawing Sheets

MEMORY SYSTEM

CROSS-REFERENCE TO RELATED APPLICATION

This application claims the benefit of and priority to Japanese Patent Application No. 2017-056573, filed Mar. 22, 2017, the entire contents of which are incorporated herein by reference.

FIELD

Embodiments described herein relate generally to a memory system.

BACKGROUND

In a storage device implemented with a semiconductor memory such as a NAND type flash memory, a memory controller performs various maintenance operations on the semiconductor memory in order to prevent, for example, a data loss. As an example of the maintenance operations, a diagnosis may be performed on the stored data. The processing amount of the maintenance operations tends to increase with the increase in capacity of the semiconductor memory.

DETAILED DESCRIPTION

An example embodiment provides a memory system in which the load of a memory controller is reduced.

In general, according to some embodiments, a memory system may be accessible from a host. The memory system may include a nonvolatile memory, a memory controller included in a first package, and a memory interface circuit included in a second package different from the first package. The memory controller may include an encoder for performing an encoding for error correction. The memory controller may be configured to encode first data into second data using the encoder and to program the second data into a location in the nonvolatile memory. The memory interface circuit may be interposed between the nonvolatile memory and the memory controller. The memory interface circuit may include a decoder for performing decoding for error correction. The memory interface circuit may read third data from a first location in the nonvolatile memory, diagnose the third data by decoding the third data using the decoder, and convey a result of the diagnosis to the memory controller.

Hereinafter, a memory system according to some embodiments will be described in detail with reference to the accompanying drawings. Meanwhile, it should be noted that the present disclosure is not limited by these embodiments.

Figure 1:
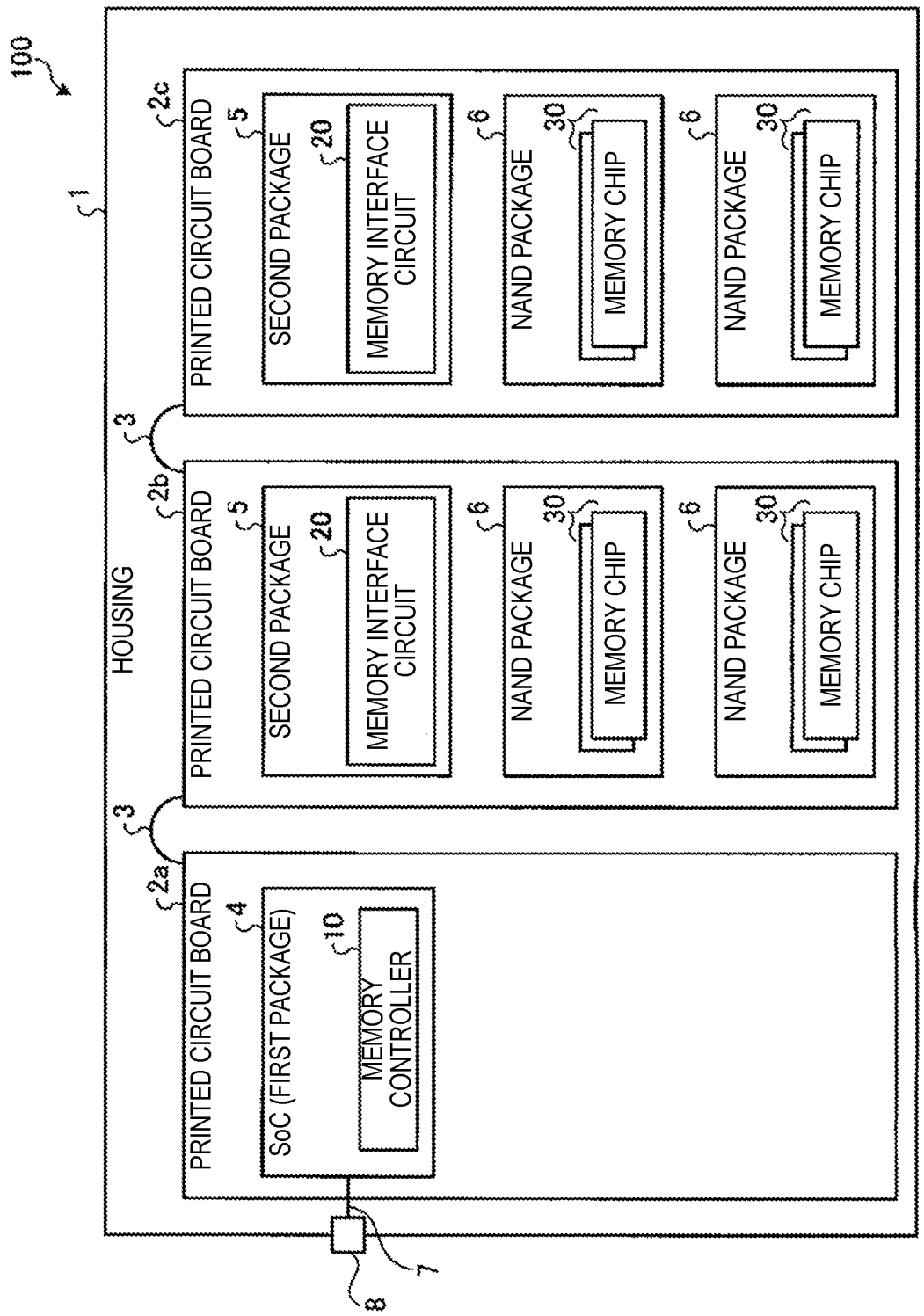
FIG. 1 is a block diagram illustrating an example package configuration of a memory system according to a first embodiment.

FIG. 1 is a block diagram illustrating an example package configuration of a memory system 100 according to a first embodiment. In the first embodiment, the memory system 100 includes printed circuit boards 2 (e.g., including a printed circuit board 2a to a printed circuit board 2c) accommodated in a housing 1 constituting the exterior of the memory system 100. The printed circuit boards 2 may be connected to each other by connectors and/or cables 3.

On the printed circuit board 2a may be mounted a first package 4 in which a memory controller 10 is enclosed as a system-on-a-chip (SoC). On each of the printed circuit boards 2b and 2c may be mounted a second package 5 in which a memory interface circuit 20 is enclosed and two NAND packages 6 in each of which two memory chips 30 are enclosed.

In the first embodiment, the housing 1 has a connector 8 to which a host 200 is to be connected, and the connector 8 is connected to the first package 4 by a host interface 7.

Figure 2:
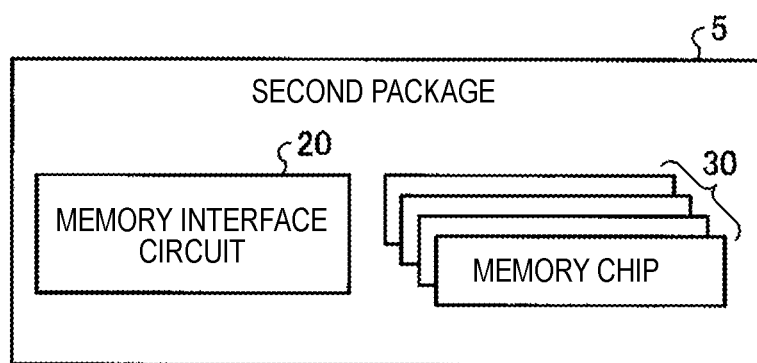
FIG. 2 is a view illustrating an example configuration in which a memory interface circuit and a plurality of memory chips are enclosed in one package.

In this manner, in the memory system 100 according to the first embodiment, the memory controller 10 and each memory interface circuit 20 can be respectively enclosed in different packages. Instead, as illustrated in FIG. 2, the memory interface circuit 20 and a plurality of memory chips 30 may be enclosed in one second package 5.

Figure 3:
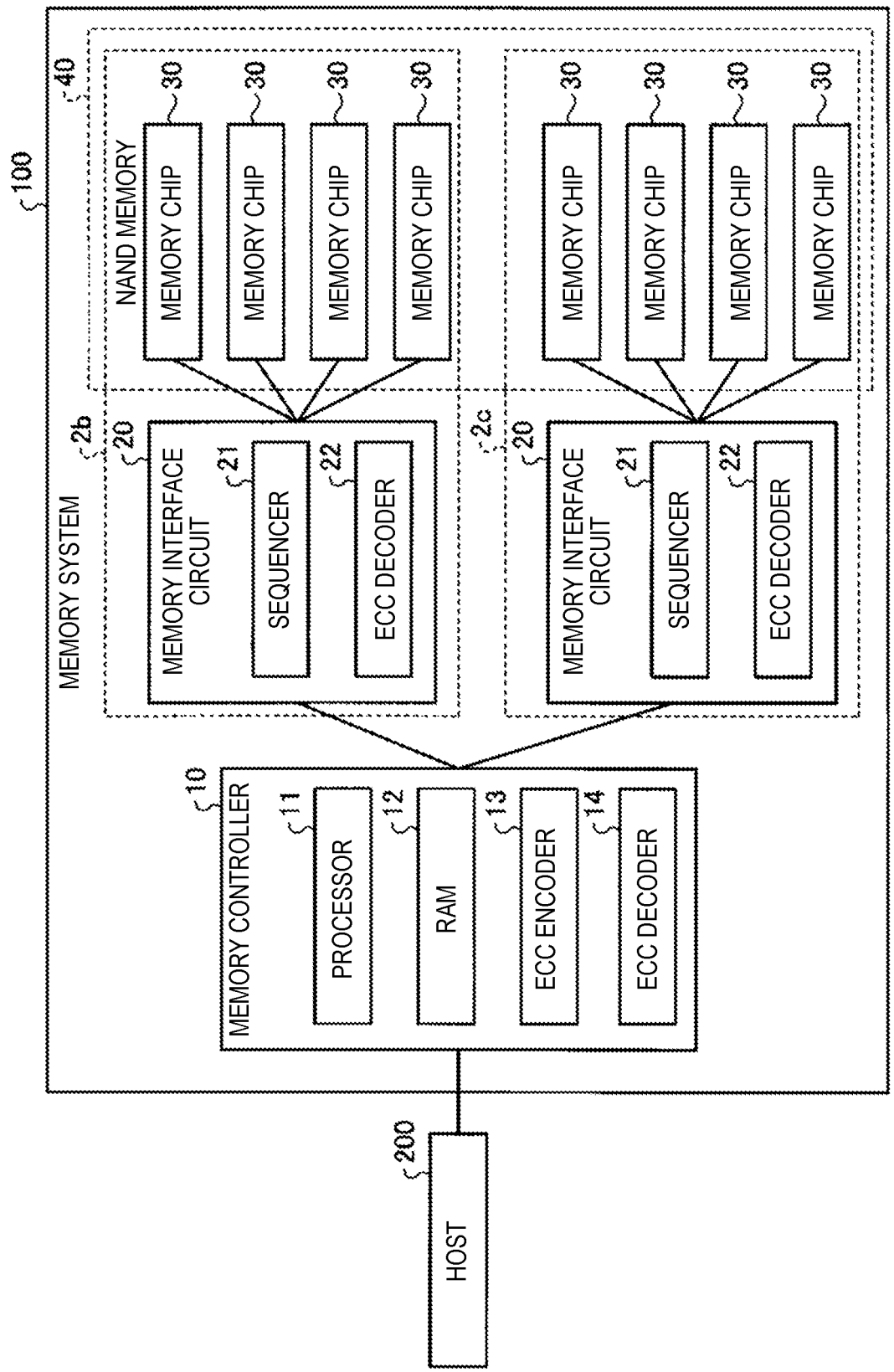
FIG. 3 is a block diagram illustrating an example of a wiring between elements of the memory system according to the first embodiment and an example internal configuration of some elements.

FIG. 3 is a block diagram illustrating an example of a wiring between elements of the memory system 100 according to the first embodiment, and an example internal configuration of some elements. In some embodiments, the memory system 100 is connected to the host 200 and may function as an external storage device of the host 200. The host 200 may be, for example, an information processing device such as a personal computer, a mobile phone, an imaging device, a portable terminal such as a tablet computer or a smartphone, a game device, or an in-vehicle terminal such as a car navigation system.

In the first embodiment, the memory controller 10 is connected to the host 200 and may control data transfer between the host 200 and eight memory chips 30. In the first embodiment, each memory interface circuit 20 does not have a host interface connectable to the host 200. Each memory interface circuit 20 may be interposed between the memory controller 10 and some memory chips 30 and can relay data and various commands (such as a read command, a write command and an erase command to be described later) issued from the memory controller 10 to control the memory chips 30 with which data transferring is to be performed. Each memory interface circuit 20 may be connected to four memory chips 30 provided in two NAND packages 6 mounted on the same printed circuit board 2. In the first embodiment, four memory chips 30 are connected to each memory interface circuit 20, while in other embodiments, a different number of memory chips 30 may be connected to each memory interface circuit 20. The memory chips 30 provided in the memory system 100 may be collectively referred to as a NAND memory 40.

In the first embodiment, in relaying various kinds of information, each memory interface circuit 20 may execute selection of a transmission source and a transmission destination of an electrical signal, amplification of an electric signal, and the like.

In one embodiment, a connection type adopted for an interface between the memory controller 10 and the memory interface circuit 20 and a connection type adopted for an interface between the memory interface circuit 20 and the memory chip 30 may be compatible with each other. The connection type may include the shape of a connector and the protocol of a communication. In the case where the compatible connection type is adopted for the interface between the memory controller 10 and the memory interface circuit 20 and for the interface between the memory interface circuit 20 and the memory chip 30, the memory interface circuit 20 may be excluded from the memory system 100, and it is possible to adopt a configuration in which the memory controller 10 and each memory chip 30 are directly connected to each other. Even when the memory controller 10 and the memory chip 30 are directly connected to each other without passing through the memory interface circuit 20, the memory system 100 may operate. That is, the memory controller 10 may directly transmit various commands to each memory chip 30. In addition, the memory controller 10 may directly exchange data with each memory chip 30. In the embodiment, by adopting the compatible connection type for the interface between the memory controller 10 and the memory interface circuit 20 and for the interface between the memory interface circuit 20 and the memory chip 30, the configuration of the memory controller 10 and the memory chip 30 does not have to be changed depending on the presence/absence of the memory interface circuit 20.

Alternatively, in another embodiment, a high-speed serial interface may be adopted as the interface between the memory controller 10 and the memory interface circuit 20, and a simpler parallel interface may be adopted as the interface between the memory interface circuit 20 and the memory chip 30. In that case, the number of pins on the memory controller 10 can decrease.

Hereinafter, a memory chip 30 connected to a memory interface circuit 20 may be expressed as a subordinate memory chip 30 of the memory interface circuit 20.

In the first embodiment, as the memory interface circuit 20 is interposed between the memory controller 10 and the memory chip 30, even when the length of the wiring between the memory controller 10 and the memory chip 30 is increased, it is possible to suppress deterioration of signal quality. In addition, since the wiring between the memory controller 10 and the memory chip 30 can be lengthened without deterioration of signal quality, the number of the memory chips 30 that may be mounted on the memory system 100 can be increased.

Since the number of the memory chips 30 connected per signal line may be reduced, the load capacitance can be reduced. Branching of signal lines can be also reduced. This makes it possible to improve signal quality and further to implement high speed signal transmission and low power consumption.

Since each memory interface circuit 20 is connected to the plurality of memory chips 30, the number of the memory chips 30 that may be mounted on the memory system 100 can be increased while increasing the number of the connection pins on the memory chip 30 side of the memory controller 10 is suppressed.

In the first embodiment, a connection line connecting the memory interface circuit 20 and each of the four memory chips 30 may or may not have a branch.

In one embodiment, the memory interface circuit 20 may include four buses, and one of the four memory chips 30 may be connected to each bus. That is, the memory interface circuit 20 and each of the four memory chips 30 may be connected in the one-to-one correspondence by different buses.

In another embodiment, the memory interface circuit 20 may include one bus which is branched into four branches. Then, one of the four memory chips 30 may be connected to each of the end portions of the four branches. The bus may be branched on the printed circuit board 2b or 2c. The bus may be branched within the NAND package 6.

Each memory chip 30 may be a nonvolatile memory, in an example, a NAND type flash memory. In some embodiments, the nonvolatile memory is not limited to the NAND type flash memory but may be a three-dimensional structure flash memory, a resistance random access memory (ReRAM), a ferroelectric random access memory (FeRAM), a magneto-resistive random access memory (MRAM) or the like.

In the first embodiment, each memory chip 30 may have a memory cell array. The memory cell array may have a plurality of memory cells arranged in the form of a matrix. The memory cell array may have a plurality of blocks which are the units of data erasure. Each block may be composed of a plurality of memory cell groups MG (see FIG. 5 and FIG. 6).

Figure 4:
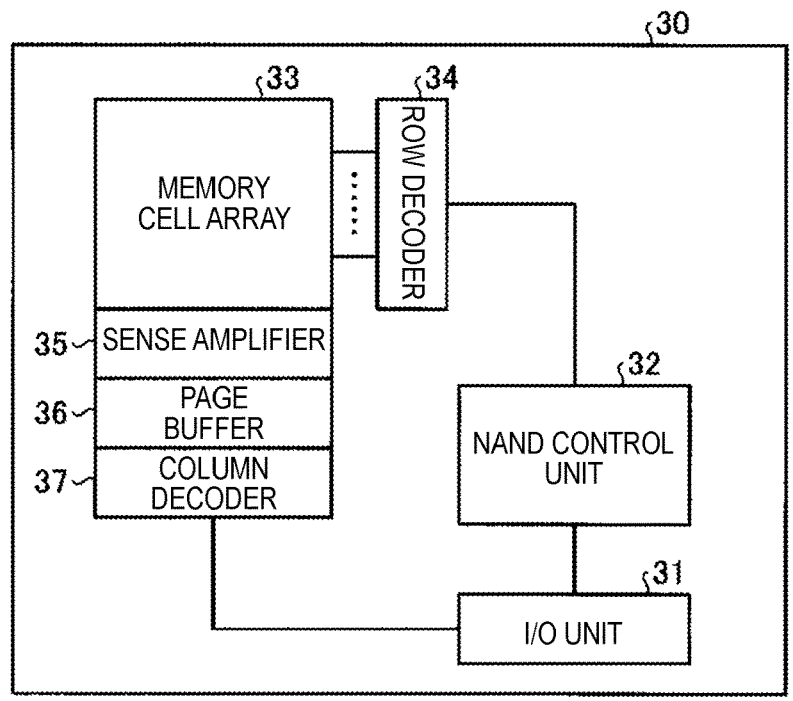
FIG. 4 is a view illustrating an example internal configuration of each memory chip.

FIG. 4 is a view illustrating an example internal configuration of each memory chip 30. In the first embodiment, the memory chip 30 includes an I/O unit 31, a NAND control unit 32, a memory cell array 33, a row decoder 34, a sense amplifier 35, a page buffer 36, and a column decoder 37. The I/O unit 31, the NAND control unit 32, the row decoder 34, the sense amplifier 35, the page buffer 36, and the column decoder 37 may constitute a peripheral circuit. The peripheral circuit may execute access (e.g., read, program, and erase) to the memory cell array 33 in response to a command supplied from the outside of the memory chip 30.

In the first embodiment, the I/O unit 31 may control input/output to/from an external device such as the memory controller 10. Upon receiving a command, the I/O unit 31 may input the command to the NAND control unit 32. The NAND control unit 32 may control the operation of the memory chip 30 based on the command or the like input from the I/O unit 31. Specifically, when a write command is input, the NAND control unit 32 may execute control to write data requested by the write command in a specified area on the memory cell array 33. When a read command is input, the NAND control unit 32 may execute control to read data requested by the read command from the memory cell array 33. The data read from the memory cell array 33 may be stored in the page buffer 36. The NAND control unit 32 may output the data stored in the page buffer 36 to the memory controller 10.

Figure 5:
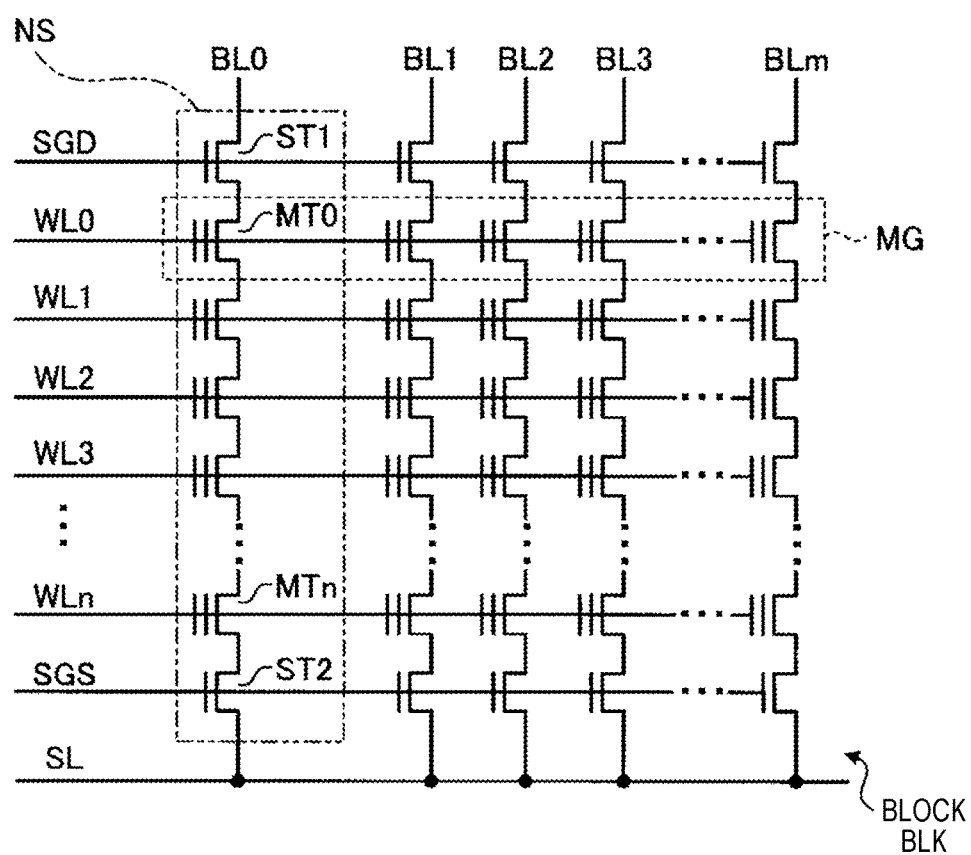
FIG. 5 is a view illustrating an example configuration of a block of a memory cell array having a two-dimensional structure.
Figure 6:
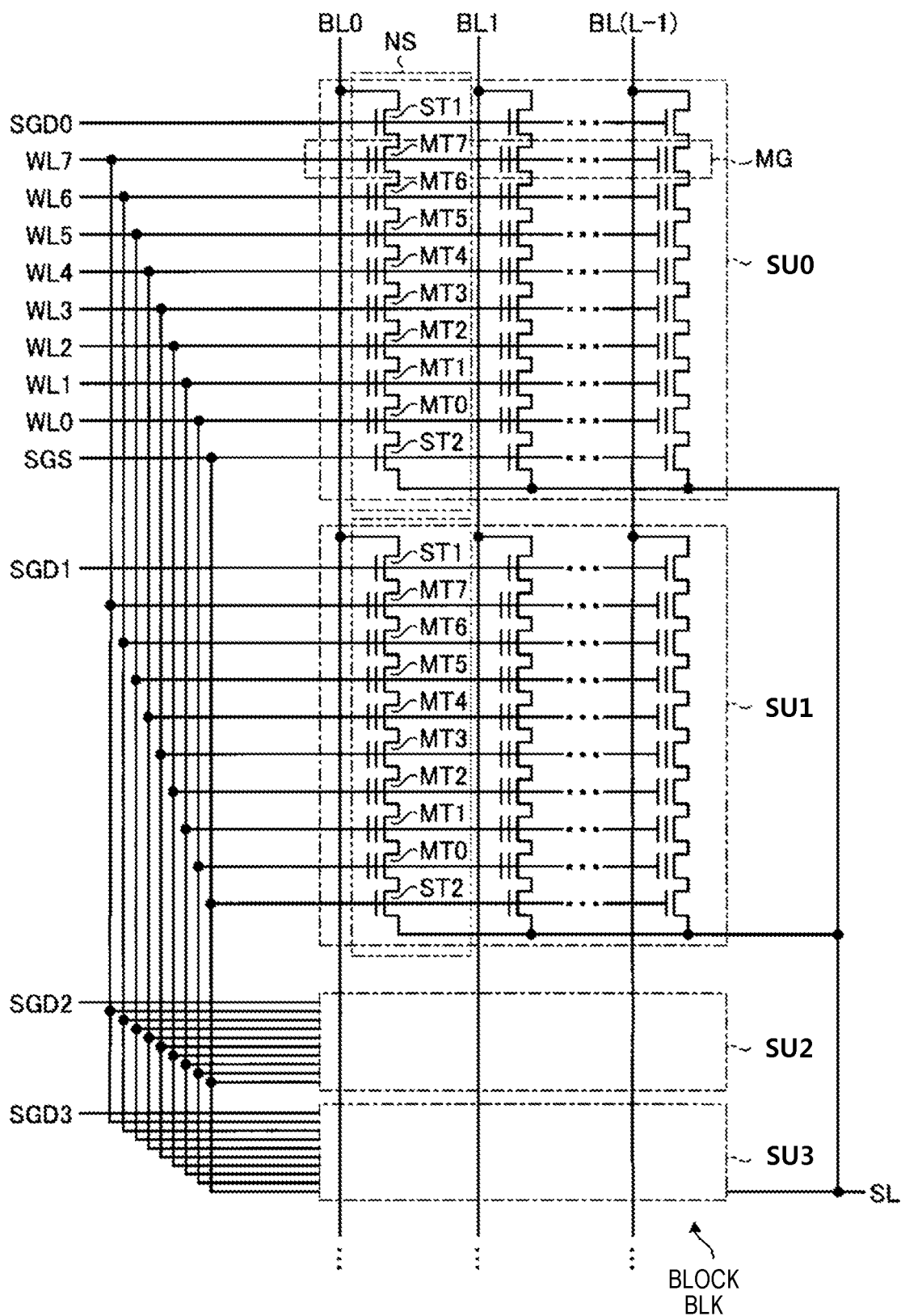
FIG. 6 is a view illustrating an example configuration of a block of a memory cell array having a three-dimensional structure.

In one embodiment, the memory cell array 33 may be a memory cell array having a two-dimensional structure as shown in FIG. 5, or a memory cell array having a three-dimensional structure as shown in FIG. 6, or other memory cell arrays.

FIG. 5 is a view illustrating an example configuration of a block of a two-dimensional structure memory cell array. FIG. 5 illustrates one of a plurality of blocks constituting the two-dimensional structure memory cell array. Other blocks of the memory cell array also have substantially the same configuration as that of FIG. 5. As illustrated in FIG. 5, a block BLK of the memory cell array may have (m+1) NAND strings NS (m is an integer of 0 or more). Each of the NAND strings NS may have (n+1) memory cell transistors MT0 to MTn (n is an integer of 0 or more) sharing a diffusion region (source region or drain region) between adjacent memory cell transistors MT and connected in series. Each of the NAND strings NS may have select transistors ST1 and ST2 disposed respectively at both ends of the string of (n+1) memory cell transistors MT0 to MTn.

Word lines WL0 to WLn may be connected to control gate electrodes of the memory cell transistors MT0 to MTn constituting the NAND string NS, respectively. The memory cell transistors MTi (i=0 to n) in each NAND string NS may be commonly connected by the same word line WLi (i=0 to n). That is, the control gate electrodes of the memory cell transistors MTi in the same row within the block BLK may be connected to the same word line WLi.

Each of the memory cell transistors MT0 to MTn may be composed of a field effect transistor having a stacked gate structure formed on a semiconductor substrate. Here, the stacked gate structure may include a charge storage layer (floating gate electrode) formed on the semiconductor substrate with a gate insulating film interposed therebetween, and a control gate electrode formed on the charge storage layer with an inter-gate insulating film interposed therebetween. Threshold voltages of the memory cell transistors MT0 to MTn may be changed according to the number of electrons stored in the floating gate electrode and may store data according to a difference in the threshold voltages.

Bit lines BL0 to BLm are respectively connected to the drains of the (m+1) select transistors ST1 in one block BLK, and a select gate line SGD is commonly connected to the gates thereof. The sources of the select transistors ST1 may be respectively connected to the drains of the memory cell transistors MT0. Similarly, a source line SL may be commonly connected to the sources of the (m+1) select transistors ST2 in one block BLK, and the select gate line SGS may be commonly connected to the gates thereof. Further, the drains of the select transistors ST2 may be respectively connected to the sources of the memory cell transistors MTn.

Each memory cell is connected to a word line and also indirectly connected to a bit line. Each memory cell may be identified by a combination of an address identifying the word line, and an address identifying the bit line. As described above, data stored in memory cells (e.g., memory cell transistors MT) in the same block BLK may be erased collectively. Meanwhile, reading and writing of data may be performed in the unit of memory cell group MG. One memory cell group MG may include a plurality of memory cells connected to one word line.

In a read operation and a program operation, according to a physical address, one word line is selected so that one memory cell group MG is selected. Pages in this memory cell group MG may be selected by the physical address.

FIG. 6 is a view illustrating an example configuration of a block of a memory cell array having a three-dimensional structure. FIG. 6 illustrates one block BLK of a plurality of blocks constituting a memory cell array having a three-dimensional structure. In one embodiment, other blocks of the memory cell array also have substantially the same configuration as that of FIG. 6.

As illustrated in FIG. 6, the block BLK includes, for example, four string units SU (SU0 to SU3), each of which includes a plurality of NAND strings NS. Each of the NAND strings NS includes, for example, eight memory cell transistors MT (MT0 to MT7) and select transistors ST1 and ST2. The number of the memory cell transistors MT is not limited to eight. The memory cell transistors MT may be interposed between the select transistors ST1 and ST2 such that current paths thereof are connected in series. The current path of the memory cell transistor MT7 on one end side of the series connection may be connected to one end of the current path of the select transistor ST1. The current path of the memory cell transistor MT0 on the other end side may be connected to one end of the current path of the select transistor ST2.

In each of the string units SU0 to SU3, the gates of the select transistors ST1 are commonly connected to the select gate lines SGD0 to SGD3, respectively. Meanwhile, the gates of the select transistors ST2 may be commonly connected to the same select gate line SGS among the plurality of string units SU. The control gates of the memory cell transistors MT0 to MT7 in the same block BLK may be commonly connected to the word lines WL0 to WL7, respectively. That is, the word lines WL0 to WL7 and the select gate line SGS may be commonly connected between the plurality of string units SU0 to SU3 in the same block BLK, while the select gate lines SGD are independently connected for string units SU0 to SU3 in the same block BLK.

The word lines WL0 to WL7 are respectively connected to the control gate electrodes of the memory cell transistors MT0 to MT7 constituting the NAND string NS. The memory cell transistors MTi (i=0 to n) in each NAND string NS may be commonly connected by the same word line WLi (i=0 to n). That is, the control gate electrodes of the memory cell transistors MTi in the same row within the block BLK may be connected to the same word line WLi.

Each memory cell may be connected to a word line and also indirectly connected to a bit line. Each memory cell may be identified by a combination of an address for identifying the word line and the select gate lines SGD0 to SGD3, and an address for identifying the bit line. As described above, data stored in memory cells (the memory cell transistors MT) in the same block BLK may be erased collectively. Meanwhile, reading and writing of data may be performed in the unit of memory cell group MG. One memory cell group MG may include a plurality of memory cells connected to one word line WL and belonging to one string unit SU.

In the read operation and the program operation, according to a physical address, one word line WL and one select gate line SGD are selected so that a memory cell group MG is selected.

In one embodiment, in a two-dimensional structure memory cell array and a three-dimensional structure memory cell array, each memory cell is capable of storing more than two values. When a memory cell is operated in one bit per cell mode (i.e., a single level cell (SLC) mode), one memory cell group MG may correspond to one page. When the memory cell is operated in multi-bit per cell mode (i.e., a multi-level cell (MLC) mode), one memory cell group MG may correspond to N pages (N is a natural number of 2 or more).

Figure 7:
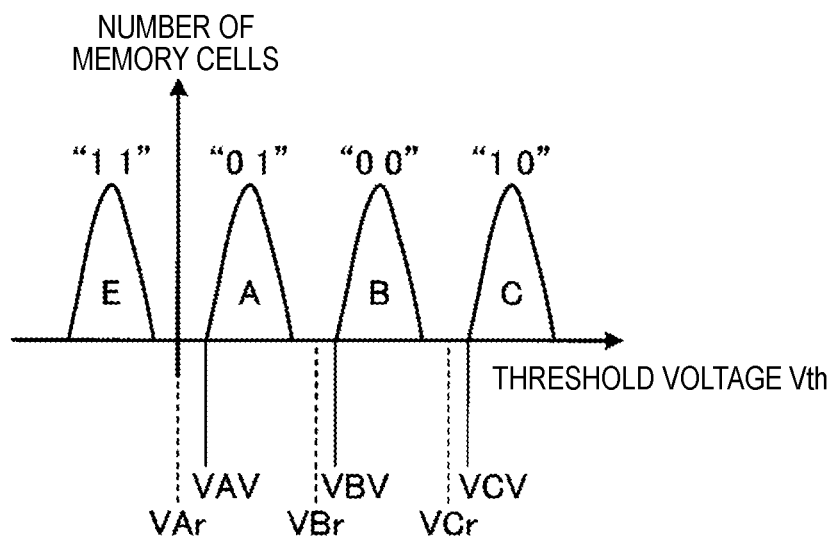
FIG. 7 is a view illustrating a distribution of threshold voltages of four-value memory cells capable of storing four-value data.

FIG. 7 illustrates a threshold voltage distribution of a four-value memory cell (2 bits/cell; MLC) capable of storing four-value data (data "11", "01", "00", and "11"). The horizontal axis represents a threshold voltage. The vertical axis represents the number of memory cells. When data is expressed as "xy", x represents upper page data and y represents lower page data. In the following description, as shown in FIG. 7, state E, state A, state B, and state C denote states from a state of the left side distribution corresponding to a low threshold voltage to a state of the right side distribution corresponding to a high threshold voltage. In FIG. 7, the threshold voltage distribution of data "11" corresponds to the state E, the threshold voltage distribution of data "01" corresponds to the state A, the threshold voltage distribution of data "00" corresponds to the state B, and the threshold voltage distribution of data "10" corresponds to the state C. The correspondence between each state and the four-value data can be freely defined. For example, the data "11", "10", "00", and "01" may correspond to the state E, the state A, the state B, and the state C, respectively, in a way different from the example described above.

Next, program processing of four-value data in a memory chip 30 will be described. Referring to FIG. 7, the state E corresponds to a threshold voltage distribution of the memory cell after block erase and is assigned with data "11". While a program voltage Vprg is applied to a selected word line connected to a memory cell, 0V may be applied to a selected bit line connected to the memory cell whose lower page data value is "0", in accordance with a value of the lower page data. Specifically, the sense amplifier 35 (see FIG. 4) may set the voltage of a bit line selected by the column decoder 37 to 0V. The row decoder 34 may apply the program voltage (e.g., a programming pulse) to the selected word line. Then, a threshold voltage of a floating gate of a memory cell located at the intersection of the selected bit line and the selected word line can rise. Each time the programming pulse is applied, the sense amplifier 35 may check whether or not the threshold voltage has reached a verify voltage (e.g., a predetermined verify voltage) corresponding to data stored in the page buffer 36 (see FIG. 4). The sense amplifier 35 may keep applying the program pulse to the row decoder 34 (see FIG. 4) until the threshold voltage reaches the verify voltage corresponding to the data. In this way, the program operation may be repeated until the threshold voltage of the memory cell whose lower page data value is "0" becomes equal to or higher than the predetermined verify voltage.

Thereafter, for a memory cell of data "11", a high voltage is not applied to the memory cell so as to suppress the undesired rising of a threshold voltage Vth of the memory cell. For example, for the memory cell of data "11", during a program operation for memory cells of other data "01", "00", and "10", a write protect voltage Vdd may be applied to a bit line connected to the memory cell of data "11" to turn off the select transistor ST1.

For a memory cell of data "01", a predetermined verify voltage VAV may be set and the program operation may be repeated until the threshold voltage of the memory cell becomes equal to or higher than the verify voltage VAV.

For a memory cell of data "00", a predetermined verify voltage VBV may be set and the program operation may be repeated until the threshold voltage of the memory cell becomes equal to or higher than the verify voltage VBV. For a memory cell of data "10", a predetermined verify voltage VCV may be set and the program operation may be repeated until the threshold voltage of the memory cell becomes equal to or higher than the verify voltage VCV. Even in a multi-bit storing mode with 3 bits or more, the basic operation may be the same as the above-mentioned operation, since only an operation of dividing a threshold voltage distribution into eight or more distributions is added to the above-mentioned operation according to the higher page data.

Next, read processing of four-value data in the memory chip 30 will be described. In reading, the sense amplifier 35 (see FIG. 4) may pre-charge a bit line BL with a power supply voltage Vcc and the row decoder 34 may sequentially apply read voltages VAr, VBr, and VCr set for their respective states to a selected word line WL. In addition, the row decoder 34 may apply a transfer voltage to the unselected word lines WL and keep the memory cells belonging to the unselected word lines WL in a conductive state. The sense amplifier 35 may determine data stored in a target memory cell by detecting a read voltage at which the charges stored by the pre-charge are flowed out to a source line SL.

As illustrated in FIG. 7, the read voltage VAr may be set between the state E and the state A, the read voltage VBr may be set between the state A and the state B, and the read voltage VCr may be set between the state B and the state C.

In a case where a lower page is to be read, the read voltage VBr may be used for determination. Upon detecting a current in the source line SL when the read voltage VBr is applied, the sense amplifier 35 may determine that the target memory cell stores data "1". Further, when no current is detected in the source line SL when the read voltage VBr is applied, the sense amplifier 35 may determine that the target memory cell stores the data "0".

In a case where an upper page is to be read, the read voltage VAr and the read voltage VCr may be used for determination. Upon detecting a current when the read voltage VAr is applied or when the read voltage VCr is applied, the sense amplifier 35 may determine that the target memory cell stores the data "1". When a current is detected when the read voltage VAr is applied and when no current is detected when the read voltage VCr is applied, the sense amplifier 35 may determine that the target memory cell stores the data "0".

In the first embodiment, referring back to FIG. 3, as described above, the memory controller 10 may control data transfer between the host 200 and the NAND memory 40.

In the first embodiment, when reading data requested by the host 200 from the NAND memory 40, the memory controller 10 may transmit a read command to the NAND memory 40. The memory controller 10 may obtain a location mapped to a logical address designated by the host 200 and set the obtained location as a read location. The read command may be sent to a destination memory chip 30 via one of the memory interface circuits 20. When the memory chip 30 receives the read command, data may be read from the memory cell array 33. The read data may be sent to the memory controller 10 via the memory interface circuit 20.

In the first embodiment, when transferring the data received from the host 200 to the NAND memory 40, the memory controller 10 may transmit the data and a program command to the NAND memory 40. The data and the program command may be sent to the destination memory chip 30 via one of the memory interface circuits 20.

In the first embodiment, when sending the data to the NAND memory 40, the memory controller 10 may determine a program location from an available area, in which no data is programmed and new data can be programmed. The memory controller 10 may map the determined program location to a logical address indicating the location of the data.

In the first embodiment, when a program location of another data (old data) has been mapped to the logical address indicating the location of the data (new data), the program location of the old data may be mapped to no logical address by update of mapping. As a result, the host 200 can read the new data from the memory system 100, but does not read the old data. Data stored in a location mapped to the logical address may be expressed as valid data. Data stored at a location not mapped to the logical address (or mapped to no logical address) may be expressed as invalid data.

In the first embodiment, when blocks having an available area are exhausted, the memory controller 10 may erase the invalid data to generate a block having an available area. Since it is rare that all the data stored in one block become invalid, in practice, the memory controller 10 may relocate (or copy) the valid data remaining in the block to another block and thereafter erase all data stored in the block of the source of the relocation. This process of relocating the valid data is called garbage collection, and a block that does not include the valid data at all due to the transfer of valid data is called a free block.

In the first embodiment, in the garbage collection, data may be read from the NAND memory 40 to the memory controller 10 and thereafter may be sent from the memory controller 10 to the NAND memory 40. Therefore, at the time of the garbage collection, the memory controller 10 may transmit a read command or a program command in the same way as the data transfer between the host 200 and the NAND memory 40.

In the first embodiment, the memory controller 10 may transmit an erase command for erasing invalid data stored in a free block. The erase command may be transferred to the target memory chip 30 by the memory interface circuit 20.

Referring to FIG. 3, the memory controller 10 includes a processor 11, a RAM 12, an ECC encoder 13, and an ECC decoder 14. In the first embodiment, the RAM 12 may be provided inside the memory controller 10 but may be provided outside the memory controller 10.

In the first embodiment, based on a firmware program, the processor 11 may perform reception and analysis of various requests from the host 200, update and maintenance of mapping between a logical address and a physical address, generation of various commands, and the like, to perform data transfer between the host 200 and the NAND memory 40 and garbage collection.

In the first embodiment, the RAM 12 may function as various buffers. For example, the RAM 12 may be used as a buffer for data transfer between the host 200 and the NAND memory 40. In another example, in the garbage collection, valid data read from the NAND memory 40 may be temporarily held in the RAM 12 until the valid data are programmed into the NAND memory 40.

In the first embodiment, the RAM 12 may function as a work area of the processor 11. For example, translation information for managing the mapping between the logical address and the physical address may be cached in the RAM 12. The processor 11 may update the translation information cached in the RAM 12 and nonvolatilize the updated translation information in the NAND memory 40 at a predetermined timing. In another example, a firmware program may be pre-stored in the NAND memory 40 and be loaded from the NAND memory 40 into the RAM 12 at the start of the memory system 100. The processor 11 may implement various functions by executing the firmware program loaded into the RAM 12.

In the first embodiment, the ECC encoder 13 (see FIG. 3) may execute encoding for error correction on data to be sent to the NAND memory 40. The encoded data may be stored in the NAND memory 40. Any method of the encoding by the ECC encoder 13 may be employed. For example, Reed Solomon (RS) encoding, Bose Chaudhuri Hocquenghem (BCH) encoding, low density parity check (LDPC) encoding, or the like may be used.

In the first embodiment, the ECC decoder 14 may decode the data encoded by the ECC encoder 13. The ECC decoder 14 may execute error correction by executing the decoding of the data received from the NAND memory 40. The ECC decoder 14 may report the degree of error detected by the decoding to the processor 11. The degree of error may indicate, for example, the number of error bits, a bit error rate, the number of times of error correction, the fact that correction has succeeded, or the fact that correction has failed.

In the first embodiment, the number of error bits may be, for example, the number of error bits in data of a predetermined unit. The bit error rate may be, for example, a rate of error bits in data of a predetermined unit. The number of times of error correction may be the number of times by which an error correction process is performed until the error correction succeeds.

Referring to FIG. 3, in the first embodiment, the memory controller 10 may further include an encoding/decoding unit (or an encoder/decoder) having a higher error correction capability than the ECC decoder 14. When the ECC decoder 14 fails in the error correction, the memory controller 10 may execute the error correction by way of the encoding/decoding unit (or the encoder/decoder).

Figure 8:
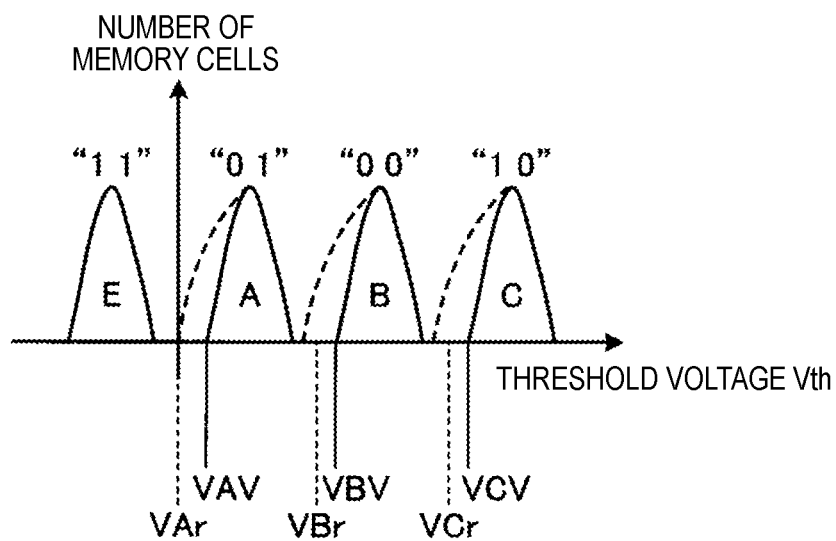
FIG. 8 is a view illustrating a variation example of the threshold voltage distribution.

In the first embodiment, in the NAND memory 40, there may be error factors such as a data retention error, a read disturb error, a program disturb error and the like. Due to these error factors, the charge amount of a memory cell may be changed. As a result, the threshold voltage distribution of the memory cell may be changed. For example, as shown in FIG. 8, in the case of a data retention error, the threshold voltage distribution of the memory cell may be changed as indicated by a dashed line. When the threshold voltage distribution is changed in this way (as shown in FIG. 8), the number of cells which may not correctly identify data with the set read voltages VAr, VBr and VCr may increase. In the following description, a memory cell whose threshold voltage is out of an allowable range due to the above-mentioned error factors and whose data cannot correctly be identified is called an error cell. A memory cell whose threshold voltage is out of the allowable range means, for example, a memory cell having a threshold voltage smaller than the read voltage VCr among memory cells in which the data "10" is written, a memory cell having a threshold voltage lower than the read voltage VBr among memory cells in which the data "00" is written, or a memory cell having a threshold voltage smaller than the read voltage VAr among memory cells in which the data "01" is written.

In the NAND memory 40, such error cells may increase with the passage of time. While the number of error cells is small, data can be recovered by the error correction process by the ECC decoder 14. However, when the number of error cells increases to some extent, the data cannot be restored by the decoding by the ECC decoder 14.

Thus, in the first embodiment, diagnosis read (i.e. patrol read) is executed in the memory system 100. The diagnosis read is a process of detecting data that cannot be restored, by trying to read each data stored in each block. When the data that cannot be restored is detected, the memory system 100 may rewrite (or refresh) the data.

In some embodiments, when the memory controller 10 executes the diagnosis read, the read data may be sequentially sent to the memory controller 10 and may be sequentially decoded by the ECC decoder 14. Accordingly, information (e.g., read command and read data) may be transferred between the memory controller 10 and each memory chip 30. As the number of the memory chips 30 connected to the memory controller 10 increases, the amount of transferred information may increase, thereby increasing the load on the memory controller 10.

Thus, in the first embodiment, each memory interface circuit 20 may execute the diagnosis read for each of the subordinate memory chips 30. As a result, it is possible to transfer information constituting the diagnosis read only between the memory chip 30 and the memory interface circuit 20, thereby reducing the load on the memory controller 10.

Referring to FIG. 3, in the first embodiment, each memory interface circuit 20 includes a sequencer 21 and an ECC decoder 22 in order to execute the diagnosis read.

In the first embodiment, the sequencer 21 may be a microcomputer unit (or a microcomputer) having a tiny processor and a memory with small capacity. The processor in the sequencer 21 may execute a predetermined operation related to the diagnosis read based on a program stored in the memory. The sequencer 21 may include a hardware circuit.

In the first embodiment, the ECC decoder 22 can decode the data encoded by the ECC encoder 13. At the time of the diagnosis read, the ECC decoder 22 may perform error correction by decoding data received from the NAND memory 40. The ECC decoder 22 may report the degree of error detected by the decoding to the sequencer 21.

In the first embodiment, each memory interface circuit 20 does not have an encoder for encoding data.

Figure 9:
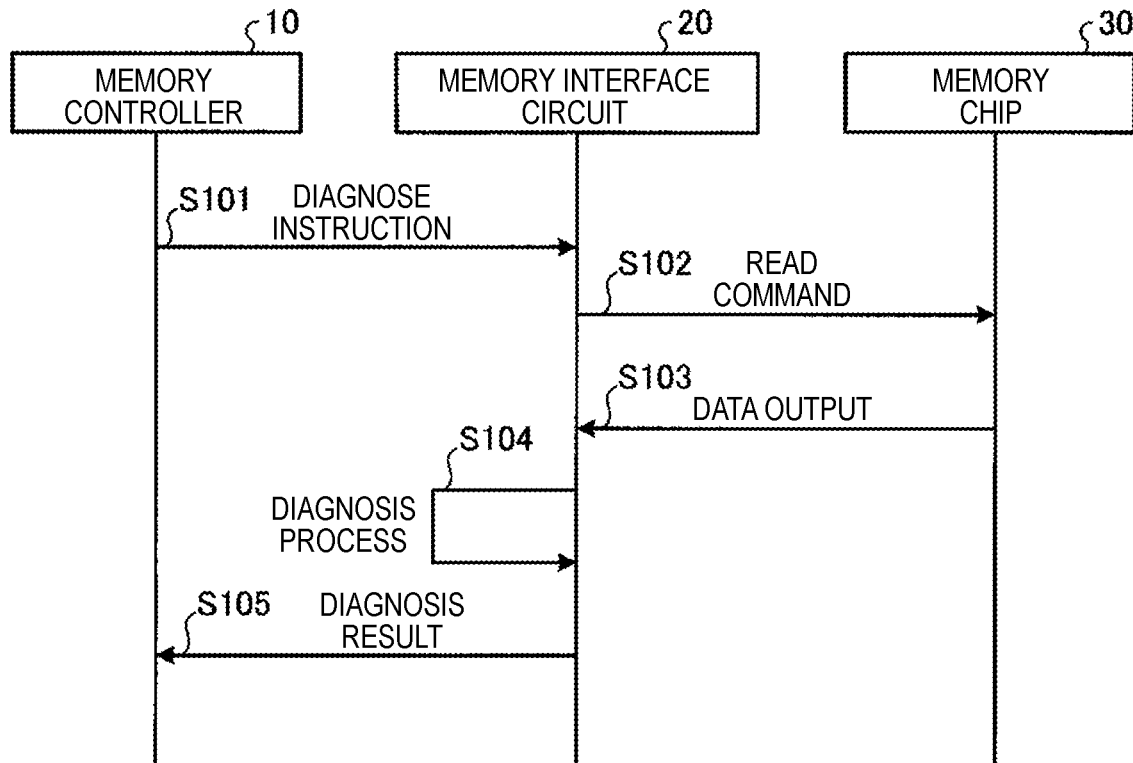
FIG. 9 is a sequence diagram illustrating the operation of the memory system according to the first embodiment.

Next, the operation of the memory system 100 of the first embodiment will be described. FIG. 9 is a sequence diagram illustrating the operation of the memory system 100 according to the first embodiment.

First, in the first embodiment, the memory controller 10 may transmit a diagnose instruction to the memory interface circuit 20 (S101). The diagnose instruction may be generated by the processor 11. The timing of transmitting the diagnose instruction is not limited to a specific timing.

In the first embodiment, the diagnose instruction may include a physical address that designates a range that the diagnosis read is to be performed. The range may be set for each block or may be set for each memory chip 30.

In another embodiment, the range of diagnosis read may not be designated. The sequencer 21 may regard storage areas of all the subordinate memory chips 30 of the memory interface circuit 20 including the sequencer 21, as the range of diagnosis read.

In the first embodiment, the diagnose instruction may include some setting information. For example, when each memory chip 30 is configured to be able to specify the read voltages (the read voltages VAr, VBr, or VCr), a specified value of the read voltages may be included in the setting information. The sequencer 21 may cause the memory chip 30 subject to the diagnosis read to use the specified value included in the setting information as a read voltage in the read operation. In this case, this setting information may not be notified each time the diagnose instruction is issued. The memory interface circuit 20 may hold the setting information once received in the sequencer 21 and thereafter may use the stored setting information.

In some embodiments, when a method of variable code rate is adopted as the encoding method of the ECC encoder 13, code rate information may be included in the setting information. The ECC decoder 22 may perform the decoding using the code rate information included in the setting information.

In one embodiment, upon receiving the diagnose instruction, the memory interface circuit 20 may execute the diagnosis read for all the data stored in the storage area of the diagnosis read range.

In another embodiment, the memory controller 10 may not transmit the diagnose instruction. The memory interface circuit 20 may start the diagnosis read without receiving the diagnose instruction.

In the first embodiment, in the diagnosis read, one or more read processes may be executed. In an example, the memory interface circuit 20 may sequentially read pages constituting the storage area of the range of the diagnosis read. In another example, the memory interface circuit 20 may define one or more representative pages, by selecting one page for each block from the storage area of the diagnosis read range, and read each of the one or more representative pages.

In the first embodiment, in each read process, the sequencer 21 of the memory interface circuit 20 may generate a read command and transmit the generated read command to a destination memory chip 30 (hereinafter, referred to as a target memory chip 30) (S102). In the target memory chip 30, a peripheral circuit may perform a read operation on the memory cell array 33 according to the read command and output data read from the memory cell array 33 to the memory interface circuit 20 (S103).

In the first embodiment, when the memory interface circuit 20 receives the data, the sequencer 21 may execute a diagnosis process by using the ECC decoder 22 (S104). The specific contents of the diagnostic process may be freely designed.

In one embodiment, in the diagnostic process, the ECC decoder 22 may perform error correction. The sequencer 21 may treat (or output) the degree of error detected by the error correction as a diagnosis result.

The sequencer 21 may determine whether or not refresh is required, based on success or failure of the error correction. When the ECC decoder 22 fails to correct the error included in the data, the sequencer 21 may determine that refresh is necessary. When the ECC decoder 22 successfully corrects the error included in the data, the sequencer 21 may determine that refresh is unnecessary. The sequencer 21 may set (or output) a location determined to be refreshed as the diagnostic result.

In another embodiment, the sequencer 21 may compare the number of errors included in the data with a predetermined threshold value and may determine whether or not refresh is necessary, based on a result of the comparison. When the number of errors included in the data exceeds the threshold value, the sequencer 21 may determine that refresh is necessary. When the number of errors included in the data does not exceed the threshold value, the sequencer 21 may determine that refresh is unnecessary. The sequencer 21 may set (or output) a location determined to be refreshed as the diagnostic result.

In the first embodiment, the processes of S102 to S104 may be repeatedly executed. The sequencer 21 may transmit the diagnosis result to the memory controller 10 at a predetermined timing (S105).

In the first embodiment, the timing for transmitting the diagnosis result to the memory controller 10 is not limited to a specific timing. In an example, the sequencer 21 may transmit the diagnosis result each time a predetermined number of read processes are completed. In another example, the sequencer 21 may transmit the diagnostic result each time the read process is completed for a unit size of storage area such as one block. In yet another example, the sequencer 21 may transmit the diagnosis result when it is determined that refresh is necessary. In yet another example, when all the storage areas within the diagnosis read range are read, the diagnosis result may be transmitted.

As described above, according to the first embodiment, the memory controller 10 may encode the data received from the host 200 by the ECC encoder 13 and program the encoded data into the NAND memory 40. The memory interface circuit 20 may be enclosed in the second package 5 (see FIG. 1) different from the first package 4 in which the memory controller 10 is enclosed. The memory interface circuit 20 may include the ECC decoder 22. The memory interface circuit 20 may be interposed between the memory controller 10 and the NAND memory 40. The memory interface circuit 20 may read the data stored in the NAND memory 40 and decode the read data by the ECC decoder 22, thereby diagnosing the read data. The memory interface circuit 20 may transmit the diagnosis result to the memory controller 10.

As a result, in the first embodiment, it is possible to transfer information constituting the diagnosis read between the memory interface circuit 20 and the NAND memory 40, thereby reducing the load on the memory controller 10.

In the first embodiments, for diagnosis, the memory interface circuit 20 may calculate the degree of error and determine whether or not the refresh is necessary, based on the degree of error. Alternatively, in the diagnosis, the memory interface circuit 20 may measure the width of a margin between the states of the distribution of two adjacent threshold voltages.

Figure 10:
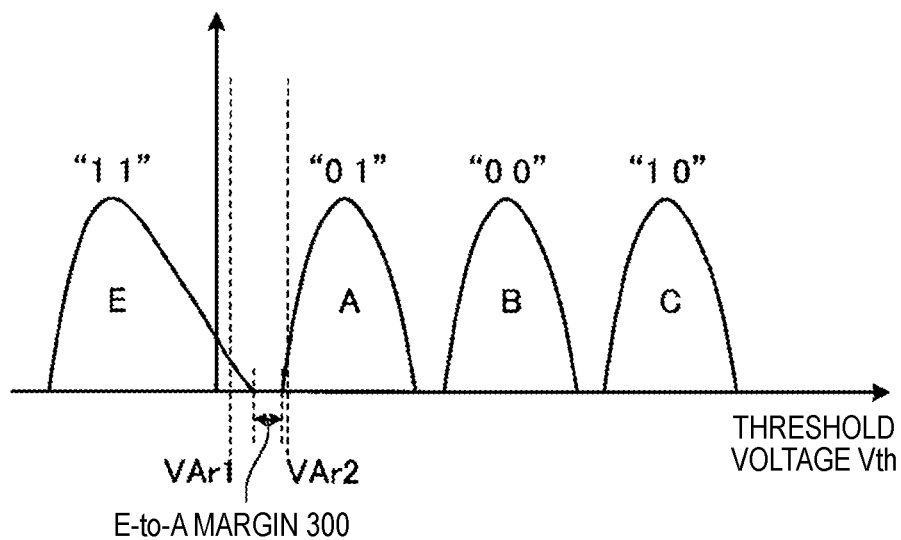
FIG. 10 is a view for explaining an E-to-A margin.

In one embodiment, it may be taken into account a case where the width of an E-to-A margin 300 exemplified in FIG. 10 is a measurement target. The E-to-A margin 300 is a margin between the states E and A. The sequencer 21 may set the read voltage VAr and execute the read processes with the upper page and the lower page as read locations. That is, the sequencer 21 may execute two read processes. The ECC decoder 22 may perform error correction on data read from the upper page and data read from the lower page. By comparing the data before and after the error correction, the sequencer 21 may count (1) the number of memory cells in which the data "11" is programmed and the data "01" is read and (2) the number of memory cells in which the data "01" is programmed and the data "11" is read. When the set read voltage VAr exists within the margin between the states E and A, the two count values (1) and (2) may be both zero. Therefore, the sequencer 21 can obtain the width of the E-to-A margin 300 by searching a range of the read voltage VAr where the two count values are both zero. The widths of other margins may be measured in the same procedure.

In this manner, the memory interface circuit 20 may acquire the widths of margins between the two adjacent states of the distribution of threshold voltages based on the number of error bits included in the data read from the NAND memory 40.

In another embodiment, in the diagnosis, the memory interface circuit 20 may set the read voltage slightly lower than VAr for reading and count the number of error bits, thereby acquiring the height (the frequency) of a threshold voltage distribution in the read voltage.

In yet another embodiment, the memory interface circuit 20 may acquire the threshold voltage distribution by executing a distribution read and transmit the acquired threshold voltage distribution to the memory controller 10 as the diagnosis result.

In the distribution read, the sequencer 21 may execute a single-level read a plurality of times while sequentially changing a read voltage for a target memory cell group. The single-level read may be a read process by using a single read voltage, which is similar to a read process in a single level cell (SLC) mode. Each bit of data read by the single-level read may indicate whether a threshold voltage of the corresponding memory cell is higher or lower than the read voltage used. Therefore, the sequencer 21 may obtain the shape of each state by sequentially changing the read voltage from the minimum voltage value of the state E to the maximum voltage value of the state C.

The memory interface circuit 20 may acquire the width of a margin between two states by executing the distribution read.

Further, In another embodiment, instead of acquiring directly the E-to-A margin 300, as illustrated in FIG. 10, the memory interface circuit 20 may measure the number of memory cells whose threshold voltages are between the voltage VAr1 and the voltage VAr2 by executing the read processes using two different voltages (VAr1 and VAr2), which are located between a threshold voltage of the apex of the state E and a threshold voltage of the apex of the state A, as read voltages and counting the number of memory cells from which different data values are obtained in the results of the two read processes. The smaller number of memory cells whose threshold voltage is located between the voltage VAr1 and the voltage VAr2 may indicate that the E-to-A margin 300 is wide. The larger number of memory cells whose threshold voltage is located between the voltage VAr1 and the voltage VAr2 may indicate that the E-to-A margin 300 is narrow. As the number of memory cells whose threshold voltage is located between the voltage VAr1 and the voltage VAr2 increases, it may indicate that the E-to-A margin 300 becomes narrower. Whether or not refresh is necessary may be determined based on the number of memory cells whose threshold voltage is located between the voltage VAr1 and the voltage VAr2.

In the first embodiment, in the normal refresh (i.e. relocating refresh), data in a block whose number of error bits exceeds a predetermined threshold value may be programmed into another block. However, the normal refresh may involve erasing to allocate a program destination block. Therefore, when the normal refresh is repeatedly executed, the NAND memory 40 may be exhausted.

In a second embodiment, each memory interface circuit 20 may instruct a reprogramming refresh which is a process of reprogramming (i.e. overwriting) the same data on a memory cell whose threshold voltage is shifted in a negative direction due to data retention or the like. Reprogramming may be to program the same data again without erasing it. The reprogramming refresh may perform a refresh with only a program operation, i.e., without an erase operation. Therefore, a damage given to the NAND memory 40 can be suppressed as compared with the normal (relocating) refresh. In addition, since the reprogramming refresh corresponds to not a program from an erased state but a program from a programmed state with a moderate threshold voltage, a program in the reprogramming refresh may be completed in a short time.

Figure 11:
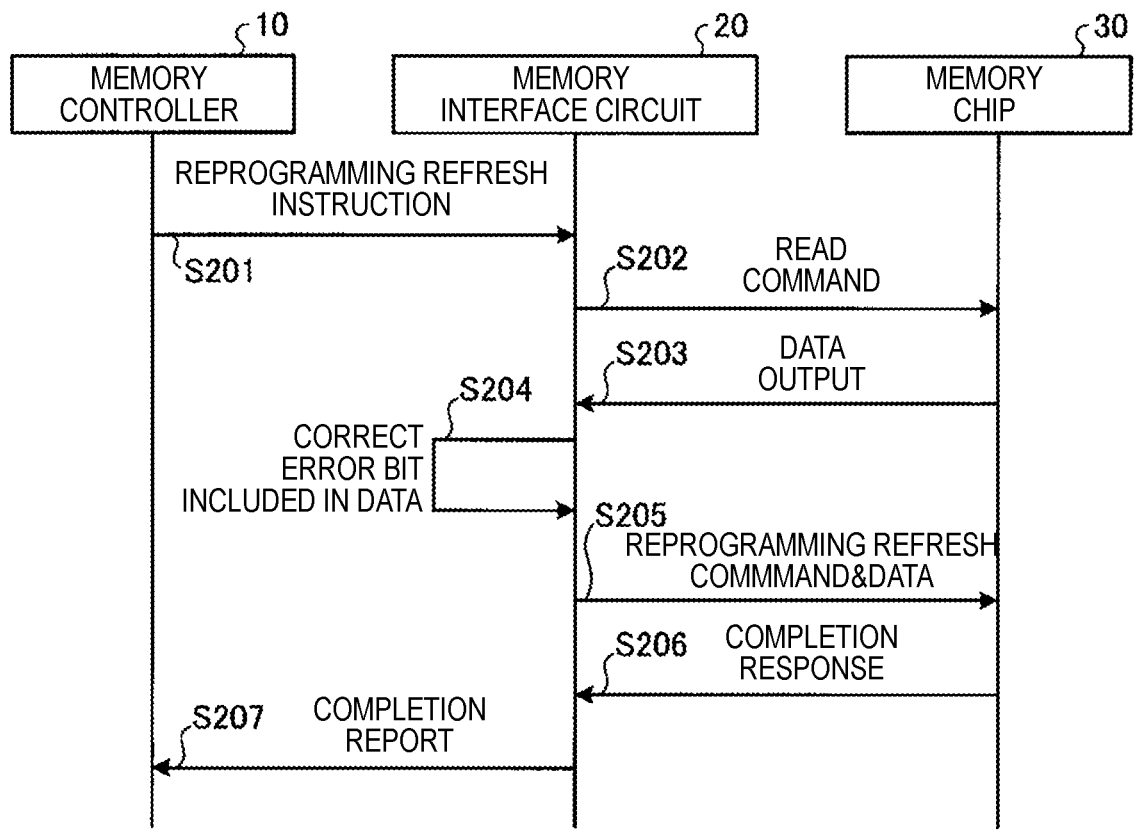
FIG. 11 is a sequence diagram for explaining the operation of a memory system according to a second embodiment.

FIG. 11 is a sequence diagram illustrating the operation of a memory system 100 according to the second embodiment.

First, in the second embodiment, the memory controller 10 may transmit a reprogramming refresh instruction to the memory interface circuit 20 (S201). Here, the reprogramming refresh instruction may include a physical address designating a target location of the reprogramming refresh. Like the diagnose instruction, the reprogramming refresh instruction may include some setting information.

In another embodiment, the memory controller 10 may not transmit the reprogramming refresh instruction, and the memory interface circuit 20 may start the reprogramming refresh without receiving the reprogramming refresh instruction.

In the second embodiment, upon receiving the reprogramming refresh instruction, the memory interface circuit 20 may transmit a read command for reading data from a reprogramming refresh target location to a destination memory chip 30 (hereinafter, referred to as a target memory chip 30) (S202). In the target memory chip 30, a peripheral circuit may perform a read operation on the memory cell array 33 according to the read command and output data read from the memory cell array 33 to the memory interface circuit 20 (S203).

In the second embodiment, when the memory interface circuit 20 receives the data, the ECC decoder 22 may execute error correction by the ECC decoder 22 (S204). In S204, error bits included in the encoded data received in S203 may be corrected. Therefore, data obtained by the process of S204 are encoded data with the corrected error bits.

In the second embodiment, the sequencer 21 may transmit the reprogramming refresh command and the corrected data to the target memory chip 30 (S205). The location of reprogramming refresh may be the same as the location at which data is read in S202 and S203.

In the second embodiment, in the target memory chip 30, the peripheral circuit may execute the reprogramming refresh. For example, in the case of the four-value memory cell illustrated in FIG. 7, for a memory cell belonging to the state A, a word line voltage for the state A may be set, a verify voltage VAV for the state A may be set, and a program operation may be performed. Similar reprogramming may be performed for memory cells belonging to the state B and the state C. As a result, when the threshold voltage has been shifted in a negative direction, the threshold voltage may be moved into an allowable range.

In the second embodiment, upon completion of the reprogramming refresh, the target memory chip 30 may transmit a completion response to the memory interface circuit 20 (S206).

In the second embodiment, upon receiving the completion response, the memory interface circuit 20 may transmit a completion report of the reprogramming refresh to the memory controller 10 (S207).

In the second embodiment, in S201, the memory controller 10 may give a reprogramming refresh target location as range information such as a block unit. In that case, the processes of S202 to S206 may be executed for each memory cell group included in the designated range information, and the process of S207 may be executed after the reprogramming refresh is completed for all the memory cell groups included in the designated range information.

As described above, according to the second embodiment, the memory controller 10 may transmit the reprogramming refresh instruction. Upon receiving the reprogramming refresh instruction, the memory interface circuit 20 may read data from the NAND memory 40 and decode the read data by the ECC decoder 22, thereby correcting error bits included in the read data. Then, the memory interface circuit 20 may reprogram the data in which the error bit has been corrected, to the same location as the location where the data is read.

As a result, in the second embodiment, it is possible to transfer data related to the refresh only between the memory interface circuit 20 and the NAND memory 40.

In some embodiments, in the normal refresh (i.e., the relocating refresh), the memory controller 10 may execute data read, allocation of a block in which data is to be rewritten, and rewrite data. Therefore, in the normal refresh, transferring of data related to the refresh may occur between the memory controller 10 and the NAND memory 40.

In the case of the reprogramming refresh of the second embodiment, since no transferring of data related to the refresh occurs between the memory controller 10 and the NAND memory 40, the load imposed on the memory controller 10 by the refresh operation may be reduced.

In the first embodiment, a method for determining the reprogramming refresh target location is not particularly limited. For example, when the operation of diagnosis read of the first embodiment is executed, the memory controller 10 may specify a reprogramming refresh target location based on the diagnosis result obtained from the memory interface circuit 20.

In the second embodiment, the memory controller 10 may determine whether to execute the normal refresh or the reprogramming refresh, based on the diagnosis result obtained from the memory interface circuit 20. When it is determined to execute the reprogramming refresh, the memory controller 10 may send a reprogramming refresh instruction to the memory interface circuit 20.

In one embodiment, the memory interface circuit 20 may measure the width of a margin (e.g., the width of the E-to-A margin 300) between two states of threshold voltage distribution and transmit the width of the margin to the memory controller 10 as a diagnosis result. When the width of the margin between the two states is larger than a predetermined threshold value, the memory controller 10 may select the reprogramming refresh and transmit a reprogramming refresh instruction. The memory controller 10 may select the normal refresh when the width of the E-to-A margin 300 is smaller than a predetermined threshold value. The method of measuring the margin width between two states is not particularly limited. The memory interface circuit 20 may calculate the margin width between the two states based on the number of error bits included in the data read from the NAND memory 40 or may calculate the margin width between the two states by executing the distribution read.

In another embodiment, the memory interface circuit 20 may transmit the number of error bits to the memory controller 10 as a diagnosis result. The memory controller 10 may select the normal refresh when the number of error bits is larger than a first threshold value. The memory controller 10 may select the reprogramming refresh when the number of error bits is smaller than the first threshold value and is larger than a second threshold value that is smaller than the first threshold value. The first threshold value is set to a value smaller than the maximum number of error bits that may be corrected by the ECC decoder 22.

In yet another embodiment, the memory controller 10 may set a reprogramming refresh target location, independently of the diagnosis read. For example, the memory controller 10 may set, as a reprogramming refresh target location, a storage area in which a predetermined time has elapsed after being programmed.

In yet another embodiment, the memory controller 10 may determine whether to execute the normal refreshing or the reprogramming refreshing, irrespective of the diagnosis read. For example, the memory controller 10 may execute the reprogramming refresh consecutively for the same storage area a predetermined number of times and then may execute the normal refresh for the storage area.

In a third embodiment, the memory interface circuit 20 may perform decoding with high correction capability in read from the NAND memory 40.

Figure 12:
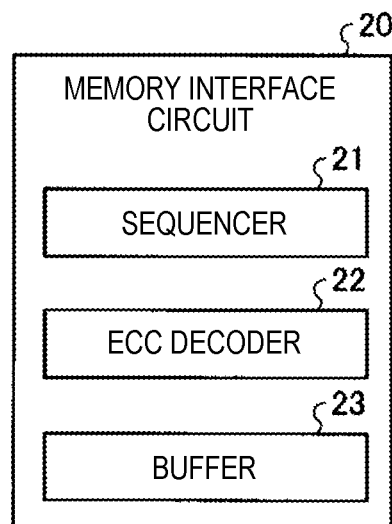
FIG. 12 is a view illustrating an example configuration of a memory interface circuit according to a third embodiment.

FIG. 12 is a view illustrating an example configuration of the memory interface circuit 20 according to the third embodiment. As illustrated in FIG. 12, the memory interface circuit 20 includes a buffer 23, in addition to the sequencer 21 and the ECC decoder 22. The type of a memory constituting the buffer 23 is not particularly limited.

In the third embodiment, the ECC encoder 13 provided in the memory controller 10 may execute encoding with an encoding method capable of decoding using a soft decision. The ECC decoder 22 provided in the memory interface circuit 20 may perform soft decision-based decoding on data encoded by the ECC encoder 13 and stored in the NAND memory 40. For example, the encoding method capable of decoding using the soft decision may be low-density parity-check code (LDPC).

In the third embodiment, the soft decision may be a decoding process using soft bit information. The soft decision may use soft bit information, that is, likelihood information. Assuming that a voltage serving as a reference for determining a bit value, that is, a voltage for a hard decision is a hard bit read voltage (referred to as an HB read voltage), soft bit information may be generated using the HB data, data that is read by using a read voltage shifted upward from the HB read voltage, and data that is read by using a read voltage shifted downward from the HB read voltage. That is, in order to obtain soft bit information, a plurality of read processes for the NAND memory 40 may be performed.

In the third embodiment, in the memory interface circuit 20, the sequencer 21 may read data a plurality of times from a memory cell group to be read while sequentially changing a read voltage to each of a plurality of voltages centered on the HB read voltage. In each read, the sequencer 21 may transmit a read command designating a read voltage. The sequencer 21 may store each data received from the NAND memory 40 in accordance with each read command in the buffer 23. The sequencer 21 may acquire soft bit information by calculation based on a plurality of data received from the NAND memory 40. The sequencer 21 may input the soft bit information to the ECC decoder 22, and the ECC decoder 22 executes error correction by using the soft bit information.

As described above, according to the third embodiment, the memory interface circuit 20 may read data a plurality of times from the NAND memory 40 while changing the read voltage, and may acquire the soft bit information based on the plurality of data read by using different read voltages. Then, the memory interface circuit 20 may input the soft bit information to the ECC decoder 22 to execute error correction.

In this way, in the third embodiment, since the memory interface circuit 20 may execute error correction with high error correction capability accompanied by a large number of read processes, the load of the memory controller 10 may be reduced, as compared with a case where the error correction is performed by the memory controller 10.

In the third embodiment, data used for soft decision may be transferred between the memory interface circuit 20 and the memory chip 30 and the memory interface circuit 20 may transmit only data corrected by the soft decision to the memory controller 10. Since transferring of the data used for the soft decision does not occur between the memory controller 10 and the NAND memory 40, the load imposed on the memory controller 10 by a soft decision process can be reduced.

In the third embodiment, the memory interface circuit 20 executes the soft decision decoding. Instead, in another embodiment, the memory interface circuit 20 may execute calculation of the soft bit information and transmit the calculated soft bit information to the memory controller 10, and the ECC decoder 14 of the memory controller 10 may execute the soft decision decoding using the soft bit information. In that case, it is possible to transfer the data for obtaining the soft bit information between the memory interface circuit 20 and the memory chip 30, and reduce the load imposed on the memory controller 10.

In a fourth embodiment, a memory interface circuit 20 may have substantially the same configuration as that of the third embodiment illustrated in FIG. 12, while the memory interface circuit 20 may support foggy&fine writing for the NAND memory 40.

In the fourth embodiment, the foggy&fine writing may be a writing method for suppressing fluctuation of a threshold voltage caused by writing in an adjacent memory cell in a multi-bit per cell mode (i.e., a multi-level cell (MLC) mode). In the foggy&fine writing, data may be once coarsely programmed into a target memory cell and then a program into a memory cell adjacent to the target memory cell may be executed. Thereafter, by re-executing the program in the target memory cell in a fine manner, the threshold voltage of the target memory cell may be adjusted to a target value. That is, according to the foggy&fine writing, data may be coarsely programmed once in one word line and thereafter the data may be reprogrammed. Reprogramming may be performed by being programmed in a past programmed location without going through erasing.

An example of the procedure of foggy&fine writing will be described below. In the fourth embodiment, foggy&fine writing may be executed on a two-dimensional structure memory cell array having four-value memory cells. The foggy&fine writing may also be executed on a three-dimensional structure memory cell array. In addition, the foggy&fine writing may also be executed on multi-value memory cells (such as triple-level cells (TLC), quad-level cells (QLC), etc.) other than four-value.

(1) First, first data of the total of two pages corresponding to a lower page and an upper page may be input to the memory chip 30 and may be coarsely programmed in the lower page and the upper page of a word line 0 (WL0) (foggy writing).

(2) Next, second data of the total of two pages corresponding to a lower page and an upper page may be input to the memory chip 30 and may be coarsely programmed in the lower page and the upper page of a word line 1 (WL1) (foggy writing).

(3) Next, the first data of the total of two pages may be input again to the memory chip 30 and may be finely programmed (i.e., reprogrammed) in the lower page and the upper page of the word line 0 (WL0) (fine writing).

(4) Next, third data of the total of two pages corresponding to a lower page and an upper page may be input to the memory chip 30 and may be coarsely programmed in the lower page and the upper page of a word line 2 (WL2) (foggy writing).

(5) Next, the second data of the total of two pages may be input again to the memory chip 30 and may be finely programmed (i.e., reprogrammed) in the lower page and the upper page of the word line 1 (WL1) (fine writing). The same procedure applies to the following.

In this way, in the fourth embodiment, in the foggy&fine writing, since two writing processes are performed on the same page, data corresponding to the same page may be input twice. The number of times of data input is not limited to two and the procedure of writing to each page is not limited thereto.

In the fourth embodiment, the sequencer 21 may receive program target data from the memory controller 10. The program target data may have been already encoded. The sequencer 21 may store the received program target data in the buffer 23. Then, the sequencer 21 may input the data stored in the buffer 23 twice to the target memory chip 30 and program the data, respectively. The first program may be the foggy write and the second program may be the fine write.

In the fourth embodiment, in the procedure of foggy&fine writing, input of the second data and the third data may occur between two inputs of the first data. Therefore, the buffer 23 (see FIG. 12) may have a capacity capable of storing at least three pieces of data (e.g., the first data, the second data, and the third data).

As described above, according to the fourth embodiment, the memory interface circuit 20 may store the program target data in the buffer 23. Then, the memory interface circuit 20 may program the program target data stored in the buffer 23 into a first location of the NAND memory 40, program other data into a second location different from the first location, and reprogram the program target data stored in the buffer 23 into the first location again. The reprogramming may be executed from the previous program without going through erasing.

As a result, since the memory interface circuit 20 instead of the memory controller 10 executes multiple inputs of the same data related to the foggy&fine writing, the load on the memory controller 10 can be reduced.

In another embodiment, data programmed by the foggy writing need not be data of all pages. For example, for one word line, data of the lowest page may be coarsely programmed for the first time (foggy write) and data of all the pages may be finely programmed for the second time (fine write). In that case, the data of the lowest page may be input twice. The memory interface circuit 20 may hold the data for which the foggy write has been executed and may execute the fine writing for the data of all the pages including the held data.

In yet another embodiment, the memory interface circuit 20 may temporarily store the program target data in the buffer 23, regardless of whether to execute the foggy&fine writing. Specifically, the sequencer 21 may store in the buffer 23 the program target data transmitted from the memory controller 10 to the NAND memory 40. Then, upon receiving a read command transmitted from the memory controller 10 to be received by the NAND memory 40, the sequencer 21 may determine whether or not read target data is stored in the buffer 23. When it is determined that the read target data is stored in the buffer 23, the sequencer 21 may read the read target data from the buffer 23 and transmit the read target data to the memory controller 10. In that case, in some embodiments, the sequencer 21 does not transfer the read command to the NAND memory 40.

As a result, when data is attempted to be read during the program, the memory controller 10 may acquire the data without waiting for completion of the program.

In a fifth embodiment, the memory interface circuit 20 may control a dynamic on die termination (ODT).

Figure 13:
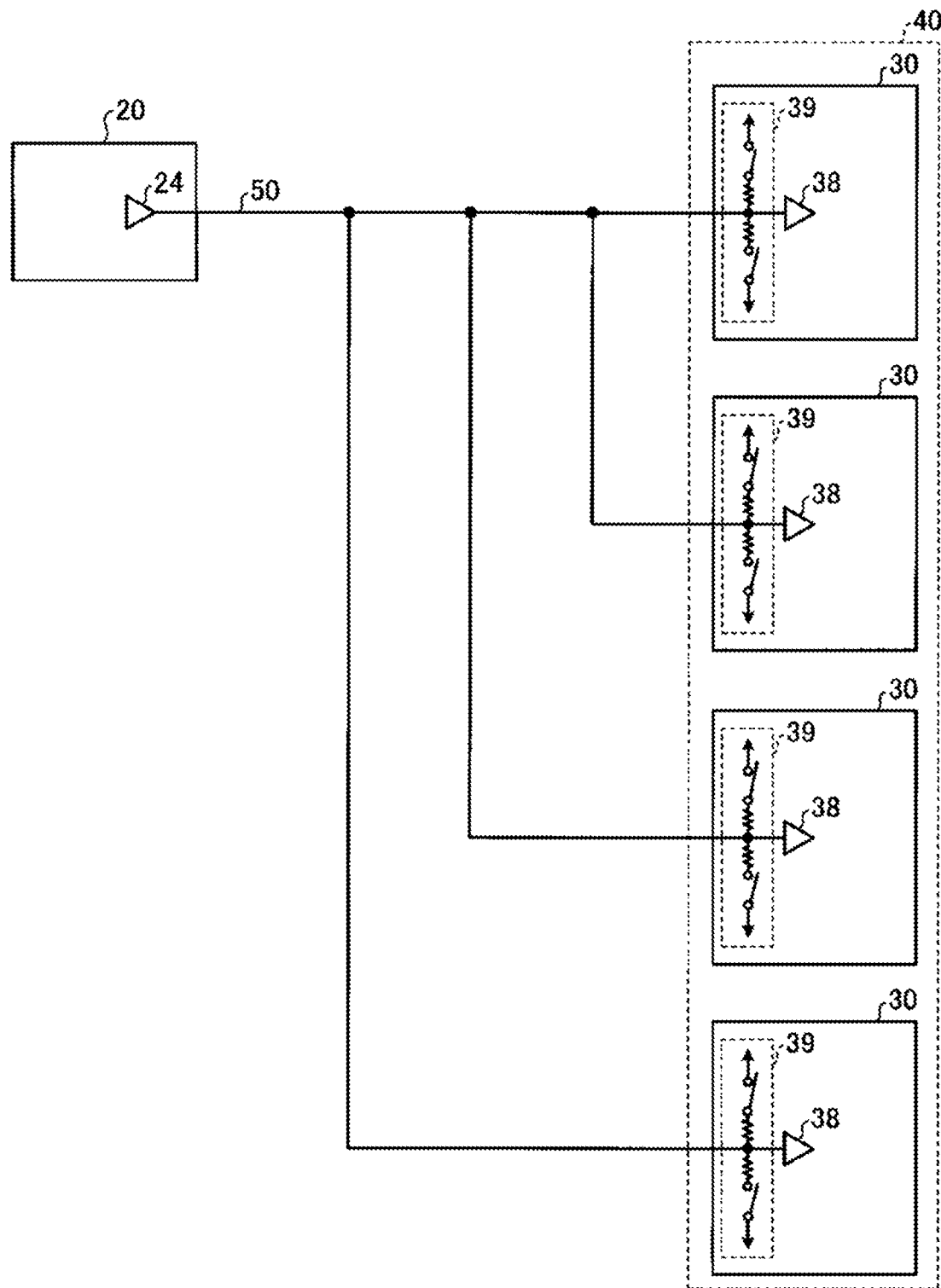
FIG. 13 is a view illustrating an example of connection of data lines between a memory interface circuit and a NAND memory according to a fifth embodiment.

FIG. 13 is a view illustrating an example of connection of a data line between the memory interface circuit 20 and the NAND memory 40. In the fifth embodiment, one end of the data line 50 is connected to a driver circuit 24 of the memory interface circuit 20. The data line 50 may be branched into four branches which are respectively connected to receiver (and driver) circuits 38 provided in different memory chips 30. An ODT circuit 39 may be provided in each of the memory chips 30. The ODT circuit 39 may include two switches for switching ON/OFF of the ODT function. The two switches may be controlled by an ODT control signal line.

Figure 14:
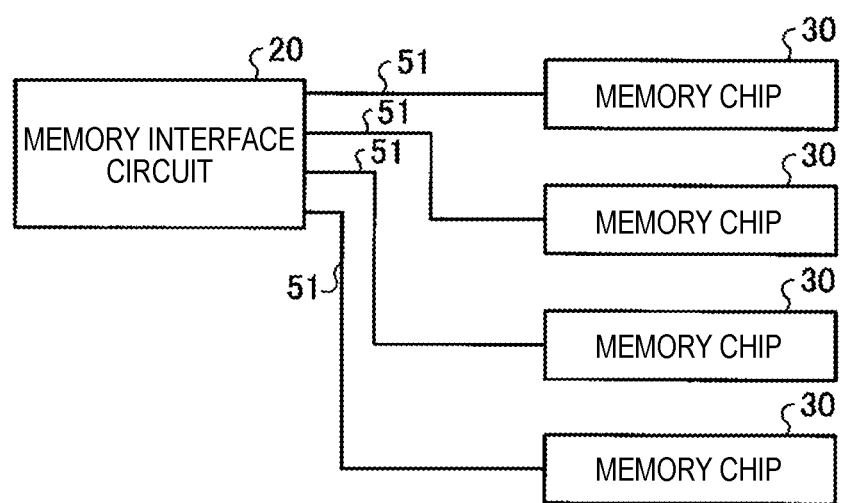
FIG. 14 is a view illustrating an example of connection of an ODT control signal line according to the fifth embodiment.

FIG. 14 is a view illustrating an example of connection of ODT control signal lines. In the fifth embodiment, as illustrated, the memory interface circuit 20 and each of the memory chips 30 are connected in the one-to-one correspondence by ODT control signal lines 51. That is, the memory chips 30 may be individually connected to the memory interface circuit 20 by one-line ODT control signal lines 51 which are not branched.

In the fifth embodiment, based on the determination on whether or not data is being transferred to one or more of the subordinate memory chips 30 and whether or not each memory chip 30 is a data transfer target memory, the sequencer 21 may turn on/off the ODT function of each subordinate memory chip 30. When transferring a command from the memory controller 10, the sequencer 21 may specify a subordinate memory chip 30 to be operated, based on address information included in the command, and determine turning-on/off of the ODT function of each subordinate memory chip 30 based on the specified subordinate memory chip 30. When the memory interface circuit 20 itself accesses the NAND memory 40, such as a diagnosis read, a memory chip 30 to be accessed may be specified as a memory chip 30 to be operated, and the turning-on/off of the ODT function of each subordinate memory chip 30 may be determined based on the specified memory chip 30.

In the fifth embodiment, a method of determining the turning-on/off of the ODT function is not particularly limited. In an example, the sequencer 21 may turn off the ODT function of a data transfer target memory chip 30 among the subordinate memory chips 30, and turn on the ODT function of the other memory chips 30. In another example, the sequencer 21 may turn on the ODT function of the data transfer target memory chip 30 and turn off the ODT function of the other memory chips 30. In yet another example, the sequencer 21 may turn on the ODT function of all the subordinate memory chips 30 while transferring data to any one of the subordinate memory chips 30, and turn off the ODT function of all the subordinate memory chips 30 while transferring data to none of the subordinate memory chips 30.

In the fifth embodiment, when the memory controller 10 instead of the memory interface circuit 20 controls the ODT function, the memory controller 10 and each of the memory chips 30 may be connected in the one-to-one correspondence by the ODT control signal lines 51 (see FIG. 14). When the memory system 100 has eight memory chips 30 as illustrated in FIG. 1, eight ODT control signal lines 51 may be connected to the memory controller 10. The number of wirings of the ODT control signal lines 51 on the memory controller 10 side may increase as the number of memory chips 30 increases.

According to the fifth embodiment, since the memory interface circuit 20 is connected to each subordinate memory chip 30 in the one-to-one correspondence by the ODT control signal lines 51, it is possible to simplify wiring of the ODT control signal lines 51 by providing a plurality of memory interface circuits 20.

In a sixth embodiment, in a three-dimensional structure memory cell array, the threshold voltage of a memory cell may be gradually changed and an error rate may raise, irrespective of whether or not it is powered on. By periodically applying an appropriate level of voltage to a word line, the change in the threshold voltage may be suppressed.

Therefore, in some embodiments, the memory interface circuit 20 may periodically read all the blocks of the subordinate memory chips 30. A read location may be one word line for each block, or may be a plurality of word lines for each block. Since a voltage (e.g., a transfer voltage or a pass voltage) is applied to each word line of the read block by periodic read process, it is possible to suppress a change in the threshold voltage.

In a seventh embodiment, the memory interface circuit 20 may measure a threshold voltage distribution by executing distribution read on a subordinate memory chip 30 in background. Then, based on the measured threshold voltage distribution, the memory interface circuit 20 may obtain a read voltage (hereinafter, referred to as an optimal read voltage) at which the number of error bits is as small as possible. Then, the memory interface circuit 20 may notify the obtained optimal read voltage to the memory controller 10.

Here, in the seventh embodiment, the memory interface circuit 20 may obtain the optimal read voltage, for example, in the unit of block. The unit for which the optimal read voltage is obtained may not be a block. For example, the optimal read voltage may be acquired in any unit such as a page unit, a word line unit, a word line group unit, a memory cell group unit or the like.

In the seventh embodiment, the memory controller 10 may cache, for example, in the RAM 12, the optimal read voltage for each block notified from the memory interface circuit 20. The memory controller 10 may update the optimal read voltage being cached for each block, according to the notification from the memory interface circuit 20. When reading a certain block, the memory controller 10 may acquire the optimal read voltage of the block from the cashed contents, and transmit a read command designating the acquired optimal read voltage to the NAND memory 40.

In this manner, in the seventh embodiment, since the memory interface circuit 20 instead of the memory controller 10 executes a large number of read processes and arithmetic operations used for determining the optimal read voltage, the load imposed on the memory controller 10 can be reduced.

In the seventh embodiment, since the information constituting the determination of the optimal read voltage may be transferred only between the memory chip 30 and the memory interface circuit 20, the load imposed on the memory controller 10 can be reduced.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A memory system accessible from a host, the memory system comprising:
   a nonvolatile memory,
   a memory controller included in a first package, and
   a memory interface circuit included in a second package, the second package being different from the first package, wherein:
   the memory controller includes an encoder for performing encoding for error correction, and is configured to:
      encode first data into second data using the encoder, and
      program the second data into a first location in the nonvolatile memory;
   the memory interface circuit is interposed between the nonvolatile memory and the memory controller, includes a decoder for performing decoding for error correction, and is configured to:
      read the second data, as third data, from the first location in the nonvolatile memory,
      diagnose the third data by decoding the third data using the decoder, and
      convey a result of the diagnosis to the memory controller,
   the memory controller is further configured to determine, on the basis of the conveyed result of the diagnosis, whether to execute a normal refresh or a reprogramming refresh,
   in a case where the normal refresh is to be executed, the memory controller reads the second data, as fourth data, from the first location in the nonvolatile memory, corrects an error bit included in the fourth data by decoding the fourth data to generate fifth data, and programs the fifth data in a second location in the nonvolatile memory, the second location being different from the first location,
   in a case where the reprogramming refresh is to be executed, the memory controller issues a reprogramming refresh instruction to the memory interface circuit; and
   the memory interface circuit is further configured to:
      in response to the reprogramming refresh instruction, read the second data, as sixth data, from the first location in the nonvolatile memory,
      correct an error bit included in the sixth data by decoding the sixth data using the decoder to generate seventh data, and
      reprogram, without erasing, the seventh data in the first location in the nonvolatile memory.

2. The memory system according to claim 1, wherein the memory includes a plurality of memory cells, each of the plurality of memory cells holds a threshold voltage corresponding to a value among a plurality of values,
   the memory interface circuit is further configured to:
      acquire a margin width on the basis of a number of error bits in the third data, and
      convey the acquired margin width to the memory controller as the result of the diagnosis; and
   the memory controller is further configured to issue the reprogramming refresh instruction on the basis of a comparison between the margin width and a first threshold value.

3. The memory system according to claim 1, wherein the memory interface circuit is further configured to:
   read data from the first location in the nonvolatile memory twice with different read voltages as two pieces of eighth data,
   acquire a number of bits having different values between the two pieces of eighth data, and
   convey the acquired number of bits to the memory controller as the result of the diagnosis; and
   the memory controller is further configured to issue the reprogramming refresh instruction on the basis of a comparison between a second threshold value and the acquired number of bits.

4. The memory system according to claim 1, wherein the memory interface circuit is further configured to:
   read data from a location in the nonvolatile memory a plurality of times with different read voltages as a plurality of pieces of ninth data,
   acquire soft bit information on the basis of the plurality of pieces of the ninth data, and
   input the acquired soft bit information to the decoder for execution of error correction.

5. The memory system according to claim 1, wherein the memory controller is further configured to transmit the second data to the memory interface circuit, and
   the memory interface circuit further includes a buffer, and is further configured to:
   store, in the buffer, the second data received from the memory controller,
   program, in a third location in the nonvolatile memory, the second data,
   program tenth data different from the second data in a fourth location, the fourth location being different from the third location in the nonvolatile memory, and
   then, reprogram, in the third location, the second data stored in the buffer.

6. The memory system according to claim 1, wherein the memory controller is further configured to transmit the second data to the memory interface circuit, and
   the memory interface circuit further includes a buffer, and is further configured to:
   store, in the buffer, the second data received from the memory controller, and
   transmit the second data stored in the buffer to the memory controller upon receiving a read command for the second data from the memory controller.

7. The memory system according to claim 1, wherein the nonvolatile memory includes a plurality of memory chips, each of which is capable of turning-on/off of an on-die termination (ODT) function, and
   the memory interface circuit is further connected to each memory chip in a one-to-one correspondence with an ODT control signal line and is further configured to turn on/off the ODT function of each memory chip by operating the ODT control signal line.

8. The memory system according to claim 1, wherein the nonvolatile memory includes a plurality of blocks, and
   the memory interface circuit is further configured to execute periodical read process for each of the plurality of blocks.

9. The memory system according to claim 1, wherein the memory interface circuit is free of an interface connected to the host.

10. The memory system according to claim 1, wherein the memory interface circuit and the nonvolatile memory are both enclosed in the second package.

11. The memory system according to claim 1, wherein (1) an interface connection between the memory interface circuit and the memory controller and (2) an interface connection between the memory interface circuit and the nonvolatile memory are compatible with each other.

12. The memory system according to claim 1, further comprising a first board and a second board, the second board being different from the first board,
    wherein the first package is mounted on the first board, and the second package and the nonvolatile memory are both mounted on the second board, the first board and the second board being connected by a connector and/or a cable.

13. A memory system accessible from a host, the memory system comprising:
    a nonvolatile memory,
    a memory controller included in a first package, and
    a memory interface circuit included in a second package, the second package being different from the first package, wherein:
    the memory controller includes an encoder for performing encoding for error correction and is configured to:
       encode first data into second data using the encoder,
       program the second data into a first location in the nonvolatile memory, and
       thereafter issue a reprogramming refresh instruction to the memory interface circuit; and
    the memory interface circuit is interposed between the nonvolatile memory and the memory controller, includes a decoder for performing decoding for error correction, and is configured to:
       read the second data, as third data, from the first location in the nonvolatile memory according to the reprogramming refresh instruction,
       correct an error bit included in the third data to generate fourth data by decoding the third data using the decoder, and
       reprogram, without erasing, the fourth data in the first location in the nonvolatile memory.

14. The memory system according to claim 13, wherein the memory interface circuit is further configured to:
    read fifth data from a second location in the nonvolatile memory,
    diagnose the fifth data, and
    convey a result of the diagnosis to the memory controller, and
    the memory controller is further configured to issue the reprogramming refresh instruction on the basis of the conveyed result of the diagnosis.

15. The memory system according to claim 14, wherein the nonvolatile memory includes a plurality of memory cells, each of the plurality of memory cells holds a threshold voltage corresponding to a value among a plurality of values,
    the memory interface circuit is further configured to:
       acquire a margin width on the basis of a number of error bits in the fifth data, and
       convey the acquired margin width to the memory controller as the result of the diagnosis; and
    the memory controller is further configured to issue the reprogramming refresh instruction on the basis of a comparison between the margin width and a first threshold value.

16. The memory system according to claim 13, wherein the memory interface circuit is further configured to:

read data from a location in the nonvolatile memory a plurality of times with different read voltages as a plurality of pieces of sixth data, acquire soft bit information on the basis of the plurality of pieces of the sixth data, and input the acquired soft bit information to the decoder for execution of error correction.

17. The memory system according to claim 13, wherein the memory interface circuit is free of an interface connected to the host.

18. The memory system according to claim 14, wherein the memory controller includes a second decoder and is further configured to issue the reprogramming refresh instruction or execute a normal refresh on the basis of the result of the diagnosis, and the normal refresh includes reading seventh data from a third location in the nonvolatile memory, correcting an error bit included in the seventh data using the second decoder to generate eighth data, and programming the eighth data into a fourth location in the nonvolatile memory, the fourth location being different from the third location.

19. The memory system according to claim 14, wherein the memory interface circuit is further configured to convey the number of error bits included in the fifth data to the memory controller as the result of the diagnosis, and the memory controller is further configured to issue the reprogramming refresh instruction on the basis of the number of error bits.

* * * * *